Inventor
Denis Manktelow Neale
By Cushman, Darby & Cushman
Attorneys 3,350,981
Patented Nov. 7, 1967

3,350,981

PHOTOGRAPHIC MULTICOLOUR PRINTING

Denis Manktelow Neale, Ilford, Essex, England, assignor to Ilford Limited, Ilford, Essex, England, a British company Filed July 9, 1965, Ser. No. 470,854
Claims priority, application Great Britain, July 17, 1964, 29,360/64
9 Claims. (Cl. 88—24)

This application is a continuation-in-part of application No. 409,795, filed Nov. 9, 1964.

This invention concerns the printing of multi-colour transparencies onto photosensitive print material having emulsions sensitive to three bands of the spectrum. Commonly these bands are the red, green and blue bands of the spectrum.

In printing a multi-colour transparency onto such print material, it is important to proportion correctly the exposures of the print material to red, green and blue light. One known way of doing this comprises exposing the print material first to white light, i.e. light containing significant components in the red, green and blue bands. When the print material has been sufficiently exposed to light in one of these bands, a filter of complementary colour is placed in the path of printing light. Thus if the exposure to green light is completed first, a magenta filter is inserted in the path of printing light. The magenta filter absorbs green light, but passes blue light and red light freely. When exposure to light in a second band is complete, the corresponding filter of complementary colour is also placed in the path of printing light. Thereafter exposure to the remaining band continues with printing light passing through the two complementary filters. When adequate exposure to the remaining band has been administered, the exposure cycle is commonly terminated by placing in the path of printing light a shutter and/or a filter of colour complementary to the colour of the remaining band.

The known method described above has the merit of allowing exposure to all three bands to proceed concurrently. It is therefore a rapid method of printing, particularly when the print material requires exposure for substantially equal times to each of the three bands.

The said known method does, however, suffer from the limitation that, because no filter is in the path of printing light during the first part of the exposure cycle, it is not readily possible to exclude from the printing light an unwanted band in which more than one emulsion of the print material has significant sensitivity or in which more than one dye of the multicolour transparency shows significant absorption.

It is, however, very seldom that the requisite exposure times to red, green and blue light are inherently equal. As a result, exposure to two of the colours may be effected sequentially with less than a 100 percent extension of the exposure cycle time. When the exposure time to one colour must exceed the sum of the exposure times to the other two colours the total time for the exposure cycle need not be extended significantly at all. For example, successive exposures to printing light passing through first a magenta and subsequently a yellow filter may allow printing of a material requiring an extended exposure to red light in the same time as would be required if exposure proceeded according to the known pattern described above wherein complementary filters are successively inserted in an initially white printing light.

It is an object of the present invention to provide a method of printing which offers certain advantages over the known practice described above. Because at least one colour selective filter is in the path of the printing light at any one time, it may be arranged to reduce or substantially eliminate that proportion of printing light which lies in a particular part of the spectrum. Thus light may be excluded from part of the spectrum in which more than one emulsion is sensitive or more than one transparency dye has a significant absorption. Furthermore, when a photoelectric exposure control system is used, as is commonly used for printing colour negatives, the same apparatus may be used in turn to control exposure to the two colours which are printed sequentially. Thus only two photocells and control systems may be used to provide the result normally obtained with three or in a further modification only one photocell and control system is used.

According to the invention, therefore, there is provided a method of printing multicolour transparencies onto a photosensitive print material having emulsions sensitive to first, second and third bands of the spectrum, which comprises exposing print material to printing light of three different qualities in turn, applied in any predetermined sequence, light of one of said qualities including light in said first and third bands, but not the second band, light of a second of said qualities including light in the said second and third bands but not the first band, and light of a third of said qualities comprising light in one only of the said bands.

According to one form of the invention printing light of three qualities in turn is obtained by placing in the path of white light at one time a colour selective filter of one of the secondary colours, yellow, magenta or cyan, placing in the path of white light at another time a colour selective filter of a different one of the said secondary colours, and placing in the path of white light at yet another time a colour selective filter which either alone or in combination with one of the said filters of secondary colour restricts printing light to one of the primary colours, red, green or blue.

In this specification the term "primary colour" means additive primary colour and the term "secondary colour" means subtractive primary colour.

According to a particular form of the invention, there is provided a method of printing multicolour transparencies onto a photosensitive print material having emulsions sensitive to first, second and third bands of the spectrum, the said first and second bands being adjacent and overlapping in a common band, the third band not overlapping either the first or second band, which comprises exposing print material to light passing a first colour selective filter which filter is chosen to absorb light in the first spectral band but to pass freely light in the third spectral band and that part of the second spectral band not including the said common band, further exposing said print material to light passing a second filter which second filter is chosen to absorb light in the second spectral band but to pass freely light in the third spectral band and that part of the first spectral band not including the said common band, further exposing said print material (a) to light passing a third colour selective filter for such additional time as may be necessary to complete exposure of the print material to said third band after completion of exposure to said first and second bands, said third filter passing light in only the third of the three said bands, or (b) to light passing a fourth filter in the path of the printing light for such time as it may be necessary to reduce the exposure of print material to light in said third band below the total time for which the print material is exposed to light in said first and second bands, said fourth filter absorbing light in said third spectral band but passing light in at least one of the said first or second bands, the exposure through the aforesaid filters being effected in any predetermined sequence.

The said colour selective filters may be carried by a common moving member causing each to intercept the path of printing light in turn, e.g. they may be carried by a rotating disc, such as a sector wheel. Either the sector wheel may rotate continuously, the exposed angles of the separate filters being adjusted to cause each to intercept the path of printing light for the required proportion of the total exposure cycle, or each of said colour selective filters may be held in the path of printing light for a period of time which is controlled by an electrical control signal. The electrical control signal may be derived from an adjustable predetermined timing circuit or it may be derived from a photoelectric integrator. Thus, in one particular form, said first, second and third colour selective filters may be carried by a common disc which is caused alternately to rotate and to rest according to electrical control signals, said first, second and third filters thereby being introduced in turn into the path of printing light for controlled times.

In another particular form, said first second and third filters may be carried by a first common disc, and said fourth filter be carried on a second disc having in addition two sectors, one of which is opaque and the other of which transmits light of all colours, each of said first and second discs being caused altenately to rotate and to rest according to separate electrical control signals.

According to one preferred form of the invention, printing light of three qualities in turn is obtained by placing in the path of white light at one time a magenta filter, at another time a yellow filter, and at yet another time a further filter which further filter either alone or in combination with one of the aforesaid filters restricts printing light to one of the primary colours, red, green or blue, the said magenta and yellow filters each removing from the spectrum of printing light a common band lying between the blue and green bands of the spectrum.

According to a particular embodiment of said preferred form, the magenta filter is in the path of printing light until such time as the integral of transmitted blue light, as determined by a photoelectric integrator, reaches a predetermined value whereupon the magenta filter is replaced by the yellow filter. When the integral of transmitted green light reaches a predetermined value as determined by a photoelectric integrator, exposure of print material to green light is terminated by causing a red or magenta filter to be placed in the path of printing light. If a magenta filter is used to terminate the exposure to green light, the yellow filter must remain in the path of printing light also.

According to another embodiment of said preferred form, the yellow filter is in the path of printing light until such time as the integral of transmitted green light, as determined by a photoelectric integrator, reaches a predetermined value whereupon the yellow filter is replaced by the magenta filter. When the integral of transmitted blue light reaches a predetermined value as determined by a photoelectric integrator, exposure of print material to blue light is terminated by causing a red or yellow filter to be placed in the path of printing light. If a yellow filter is used to terminate the exposure to blue light, the magenta filter must remain in the path of printing light also.

According to an alternative preferred form of the invention, printing light of three qualities in turn is obtained by placing in the path of white light at one time a magenta filter, at another time a cyan filter, and at yet another time a third filter which either alone or in combination with one of the aforesaid filters restricts the printing light to one of the primary colours, red, green or blue, the said magenta and cyan filters each removing from the spectrum of printing light a common band lying between the green and red bands of the spectrum.

According to a particular embodiment of said alternative preferred form, the magenta filter is in the path of printing light until such time as the integral of transmitted red light, as determined by a photoelectric integrator, reaches a predetermined value whereupon the magenta filter is replaced by the cyan filter. When the integral of transmitted green light reaches a predetermined value as determined by a photoelectric integrator, exposure of print material to green light is terminated by causing a blue or magenta filter to be placed in the path of printing light. If a magenta filter is used to terminate the exposure to green light, the cyan filter must remain in the path of printing light also.

According to another embodiment of said alternative preferred form, the cyan filter is in the path of printing light until such time as the integral of transmitted green light, as determined by a photoelectric integrator, reaches a predetermined value whereupon the cyan filter is replaced by the magenta filter. When the integral of transmitted red light reaches a predetermined value as determined by a photoelectric integrator, exposure of print material to red light is terminated by causing a blue or cyan filter to be placed in the path of printing light. If a cyan filter is used to terminate the exposure to red light, the magenta filter must remain in the path of printing light also.

The invention will now be described with particular reference to its use when printing a positive colour print from a positive colour transparency. In this example the print material used has a very slow red speed and a considerable overlap in the sensitivities of the blue and green sensitized emulsion, this constituting a common band of sensitivities. In this example the magenta filter used passes only the red light and that part of the blue light which is not in the common band. The yellow filter used passes only the red light and that part of the green light which is not in the common band. The red light is printed continuously.

In the following description use is made of the method of printing described in our co-pending U.S. application No. 409,795, filed Nov. 9, 1964 (of which this present application is a continuation-in-part), wherein a single photo-cell is used. The photo-cell is first of all used to assess the amount of red light which is required, as more red light than blue or green light is required. The photo-cell is then used to assess consecutively blue and green light exposures during the printing.

Figure 1:
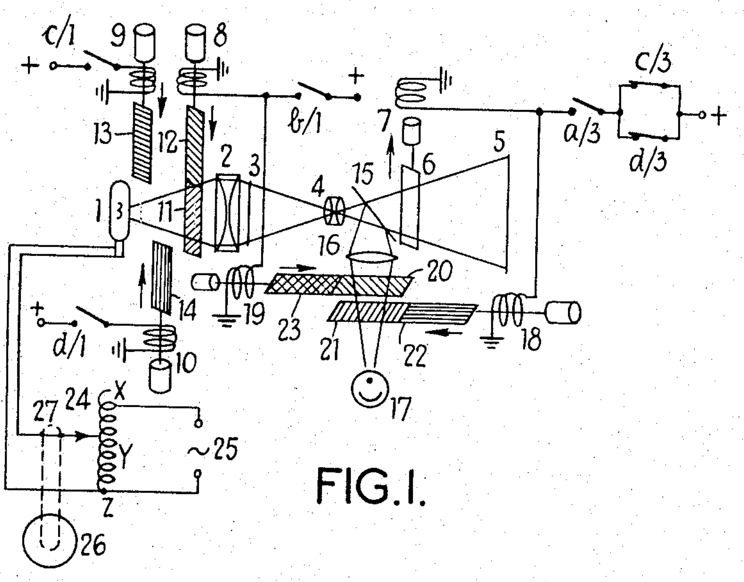
FIG. 1 represents the optical system and the means for controlling intensity and quality of colour of printing light in a photographic colour printer.

Referring to these drawings in FIG. 1 light from a lamp 1 is focussed by a condensing lens 2 to pass through a colour transparency 3 and an objective lens 4. The objective lens 4 forms an image of the transparency 3 on the print material 5 when the shutter 6 is withdrawn by the solenoid 7 operating in the direction shown by the arrow.

Quality of printing light is controlled by operation of further solenoids 8, 9 and 10, each of which is illustrated in the position occupied when it is de-energised. Operation of solenoid 8 causes a magenta filter 11 in the path of printing light to be replaced by a yellow filter 12. Energisation of solenoids 9 and 10 respectively result in the insertion of a red filter 13 and a cyan filter 14 in the path of printing light.

An inclined glass plate 15 deflects a proportion of printing light passing lens 4 whence the deflected beam is focussed by lens 16 onto a vacuum photocell 17. With solenoids 18 and 19 de-energised, the said deflected beam passes in succession through a magenta filter 20 and a red filter 21. Energisation of solenoids 18 and 19 respectively result in the replacement of the red filter 21 by the cyan filter 22 and the replacement of the magenta filter 20 by the green filter 23.

The lamp 1 is operated from a variable voltage transformer 24 connected to an alternating current supply 25. The voltage applied to the lamp may be varied by operation of the motor 26 which is mechanically coupled to the control spindle of the variable transformer 24.

Figures 2, 3:
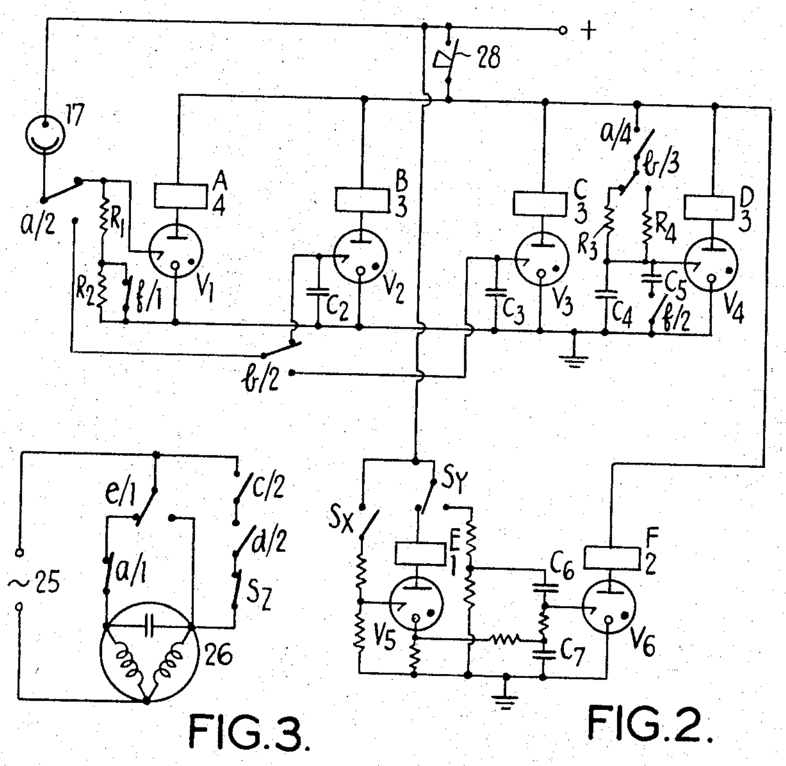
FIG. 2 represents the electronic control circuit required to operate components shown in FIG. 1.
FIG. 3 represents a circuit controlling operation of a motor represented in FIG. 1.

In FIG. 3 it will be seen that the motor 26 is a reversible split phase induction motor operating from the alternating current supply 25, through contacts on relays A, C, D, E an a limit switch $S_z$.

In FIG. 2 the trigger tubes $V_1$, $V_2$, $V_3$ and $V_4$ control respectively the setting of intensity of red printing light, the exposure integral of blue printing light, the exposure integral of green printing light and the exposure time to red printing light. (The function of trigger tubes $V_5$ and $V_6$ is described below.) In FIGS. 1–3, all relay contacts are indicated in the positions occupied when the corresponding relays are de-energised.

The operation of the printing machine will now be described. Before initiation of a printing cycle, the machine normally rests with trigger tubes $V_1$, $V_2$, $V_3$, $V_4$ conducting and relays *A*/4, *B*/3, *C*/3 and *D*/3 energised. In this condition, contacts *a*/1 are open and contacts *c*/2 and *d*/2 are closed, thereby causing motor 26 to move the sliding contact 27 of the variable transformer 24 to the end marked Z in FIG. 1, thereby opening contacts on a limit switch $S_z$ and de-energising motor 26. The lamp 1 thus receives substantially no supply from the transformer 24 in this condition. To initiate a printing cycle the manual key switch 28 is briefly opened thereby extinguishing the discharges in tubes $V_1$ to $V_4$, causing relay *A*/4, *B*/3, *C*/3, *D*/3 to release and thereby causing all solenoids to assume the positions indicated in FIG. 1. Release of relays *C*/3 and *D*/3 causes contacts *c*/2 and *d*/2 to open. Release to relay *A*/4 causes contacts *a*/1 to close thereby causing motor 26 to drive the sliding contact 27 of transformer 24 towards the end of the winding indicated by X in FIG. 1. As this proceeds a progressively increasing voltage is applied to lamp 1 which therefore provides a progressively increased light output. No light can yet reach the print material 5 because shutter 6 obstructs the printing path as shown. Red light from lamp 1 can however pass the magenta filter 11, the transparency 3, and after deflection by the glass plate 15 can pass also the magenta filter 20 and red filter 21 to reach the vacuum photocell 17. The photo-current passed by photocell 17 is proportional to the incident intensity of red light. This photo-current flows through load resistor $R_1$ and contacts *f*/1 to ground. The positive potential of the trigger electrode of $V_1$, is therefore proportional to the intensity of red light transmitted by transparency 3. With a typical transparency the light output from lamp 1 soon increases to a value such that the potential of the trigger electrode of $V_1$ is raised to the critical value at which the tube fires. When $V_1$ fires relay *A*/4 is energised and the contact *a*/1 opens so that the motor 26 stops and lamp 1 continues to pass through transparency 3 a substantially constant and pre-determined intensity of red printing light. Energisation of relay *A*/4 causes contacts *a*/3 to close so that solenoid 7 is energised to withdraw the shutter 6 from the path of printing light. Exposure of print material to blue and red light passing magenta filter 11 thus commences. Closure of contacts *a*/4 initiates the timing of exposure of the print material to red light which is determined by the charging of capacitor $C_4$ through resistor $R_3$ or $R_4$ until trigger tube $V_4$ fires. Closure of contacts *a*/3 energises also solenoid 18 thereby substituting cyan filter 22 for the red filter 21 in the path of light reaching photocell 17. Thus only blue light can now pass the magenta filters 11, 20 and the cyan filter 22 to reach the photocell 17. Energisation of relay *A*/4 furthermore operates contacts *a*/2 so that the photo-current from photocell 17 flows via *a*/2 and *b*/2 to charge the capacitor $C_2$. Photocell 17, capacitor $C_2$, trigger tube $V_2$ and relay *B*/3 now comprise a conventional integrating exposure circuit of known type. Blue light of printing quality reaching photocell 17 produces a photo-current charging capacitor $C_2$ until the voltage appearing across $C_2$ is sufficient to fire trigger tube $V_2$ and thereby to energise relay *B*/3.

Energisation of relay *B*/3 closes contacts *b*/1 thereby energising solenoid 8 which substitutes the yellow filter 12 for the magenta filter 11 in the path of printing light. Thus printing light no longer contains blue light, but now contains green light in addition to the red light which will still be present if trigger tube $V_4$ has not yet fired. Closure of contacts *b*/1 results also in the energisation of solenoid 19 thereby substituting the green filter 23 for the magenta filter 20 in the path of light reaching photo-cell 17. Thus only green light of printing quality can now pass yellow filter 12, transparency 3, green filter 23, and yellow filter 22 to reach the photo-cell 17. Energisation of relay *B*/3 has furthermore operated contacts *b*/2 so that the photo-current delivered by photo-cell 17 and now proportional to the intensity of green light of printing quality passes via contacts *a*/2 and *b*/2 to the capacitor $C_3$. It will now be recognised that photo-cell 17, capacitor $C_3$, trigger tube $V_3$ and relay *C*/3 form an integrating exposure control circuit of known type controlling the exposure to green light of the print material 5. When a sufficient charge has been accumulated in capacitor $C_3$, trigger tube $V_3$ fires and energises relay *C*/3. Energisation of relay *c*/3 closes contact *c*/1, energises solenoid 9 and inserts in the path of printing light the red filter 13, thereby terminating exposure of the print material 5 to green light.

Exposure of print material 5 to red light may however still continue since red light is still free to pass red filter 13, yellow filter 12 and transparency 3 provided trigger tube $V_4$ has not yet fired. When the capacitor $C_4$ has charged sufficiently, however, $V_4$ fires to energise relay *D*/3. Contacts *d*/1 then closes to energise solenoid 10 and insert in the path of printing light the cyan filter 14 thereby terminating exposure of the print material 5 to red light.

Thus the print material has been printed using (a) blue light which has had excluded from it that part of the blue light which the green sensitive emulsion is sensitive to, (b) green light which has had excluded from it that part of the green light which the blue sensitive emulsion is sensitive to and (c) continuously using red light. Thus no printing time has been lost.

It will be noted that should $V_4$ fire before $V_3$ the exposure to green light may continue after the termination of exposure to red light since green light can pass the cyan filter 14, the yellow filter 12 and the tranparency 3.

When the relays *C*/3 and *D*/3 are both energised, the exposure of print material 5 to all three colours, red, green and blue, is complete. Opening of contacts *C*/3 and *d*/3 causes solenoid 7 to release thereby allowing shutter 6 once more to obseruct the path of printing light. Closure of contacts *c*/2 and *d*/2 causes motor 26 to turn the moving contact 27 of transformer 24 in a direction reducing the voltage applied to lamp 1. When the moving contact 27 approaches the end of the winding marked Z, a limit switch $S_z$ opens and thereby stops the motor. The equipment is now once more in the "at rest" position.

The function of contacts *b*/3 will now be described. It will be appreciated that the initial estimation of red printing light intensity is made with the magenta filter 11 in the path of light reaching transparency 3. If the minor absorbencies to red light of the magenta filter 11 and the yellow filter 12 are not substantially equal the print material 5 will receive an exposure to red light which, measured as an integral of red light intensity against time, will depend on the relative times for which the magenta and yellow filters 11 and 12 are in operative position. This limitation is overcome in the apparatus described here by arranging that the rate of charging of capacitor $C_4$ shall be substantially proportional to the red light transmission of whichever filter, 11 or 12, is in the path of printing light at any time. For this purpose the resistances $R_3$ and $R_4$ are chosen to be substantially in the same ratio as the red light transmittances of filters 12 and 11 respectively. When relay *B*/3 energises and thereby causes filter 12 to be substituted for filter 11, contacts *b*/3 operate so that the rate of charging of capacitor $C_4$ changes appropriately and the total time of exposure to red light is either increased or decreased to compensate for an early operation of relay *B*/3, according to whether substitution of filter 12 for filter 11 produces a reduction or an increase in the intensity of red light reaching transparency 3.

In the foregoing description it has been assumed that tube $V_1$ will fire before motor 26 causes lamp 1 to operate at maximum intensity. When an abnormally dense transparency is to be printed the moving contact 27 of transformer 24 may reach the end of the winding marked X before an intensity of red light reaches photo-cell 17 sufficient to fire trigger tube $V_1$. In this event a mechanical limit switch $S_x$ closes and causes trigger tube $V_5$ to fire energising relay *E*/1. Contacts *e*/1 now operate reversing the direction of rotation of motor 26 and so once more reducing the intensity of light emitted by lamp 1. When the moving contact 27 reaches the point Y near the end marked Z, a third limit switch $S_y$ operates de-energising relay *E*/1, and furthermore causing a positive going pulse to be applied through capacitor $C_6$ to the trigger electrode of tube $V_6$. Since $C_5$ was conducting immediately prior to operation of limit switch $S_y$, a positive charge will be present at capacitor $C_7$. This charge applies a positive bias to the trigger electrode of tube $V_6$ which, in combination with the positive-going pulse applied through $C_6$ causes $V_6$ to fire energising relay *F*/2. Contacts *f*/1 now open placing photo-cell load resistor $R_2$ in series with photo-cell load resistor $R_1$ and contact *f*/2 closes to place timing capacitor $C_5$ in parallel with timing capacitor $C_4$. Release of relay *E*/1 causes contacts *e*/1 to return to the position indicated and motor 26 reverses once more to increase progressively the voltage applied to lamp 1. As the photo-cell load resistance now comprises $R_1$ and $R_2$ in series $V_1$ will fire at a predetermined level of red light incident of photo-cell 17, which level is lower than normal in the ratio $R_1/(R_1+R_2)$. It is furthermore arranged that $R_2/R_1$ approximately equals $C_5/C_4$, and it accordingly follows that the exposure time to red light is extended in proportion to the reduction in pre-adjusted intensity of red light. Any abnormality in intensity of blue or green printing light will be compensated automatically by the integrating action of capacitors $C_2$ and $C_3$ respectively.

When an exposure has been completed with relay *F*/2 energised, the "at rest" condition of the apparatus comprises $V_1$ to $V_4$ conducting, $V_5$ non-conducting and $V_6$ conducting. Initiation of a further exposure cycle extinguishes the discharge in $V_6$ in addition to extinguishing the discharges in $V_1$ to $V_4$.

I claim:

1. A method of printing multicolour transparencies onto a photosensitive print material having emulsions sensitive to first, second and third bands of the spectrum, the said first and second bands being adjacent and overlapping in a common band, the third band not overlapping either the first or second band, which comprises exposing print material to light passing a first colour selective filter which filter is chosen to absorb light in the first spectral band but to pass freely light in the third spectral band and that part of the second spectral band excluding the said common band, further exposing said print material to light passing a second filter which second filter is chosen to absorb light in the second spectral band but to pass freely light in the third spectral band and that part of the first spectral band excluding the said common band, further exposing said print material to light passing a third colour selective filter for such additional time as may be necessary to complete exposure of the print material to said third band after completion of exposure to said first and second bands, said third filter passing light in only the third of the three said bands.

2. A method according to claim 1 wherein the colour selective filters are carried by a common moving member which is in the form of a sector wheel and including the step of rotating the sector wheel continuously during exposure of the print material.

3. A method according to claim 1 wherein the colour selective filters are carried by a common moving member which is a disc on which are mounted the colour selective filters, and including the step of holding the selective filters in the path of the printing light for a period of time which is controlled by an electrical control signal derived from an adjustable pre-determined timing circuit.

4. A method according to claim 1 wherein the colour selective filters are carried by a common moving member which is a disc on which are mounted colour selective filters and including the step of holding the selective filters in the path of the printing light for a period of time which is controlled by an electrical control signal derived from a photo-electric integrater.

5. A method according to claim 1 wherein a printing light of three qualities in turn is obtained by placing in the path of white light, at one time a magenta filter, at another time a yellow filter, and at yet another time a further filter which restricts printing light to one of the primary colours, red, green and blue, the said magenta and yellow filters each removing from the spectrum of printing light a common band lying between the green and blue bands of the spectrum.

6. A method according to claim 1 wherein printing light of three qualities in turn is obtained by placing in the path of white light, at one time a magenta filter, at another time a cyan filter, and at yet another time a third filter which restricts the printing light to one of the primary colours, red, green and blue, the said magenta and cyan filters each removing from the spectrum of printing light a common band lying between the green and red bands of the spectrum.

7. A method of printing multicolour transparencies onto a photosensitive print material having emulsions sensitive to first, second and third bands of the spectrum, the said first and second bands being adjacent and overlapping in a common band, the third band not overlapping either the first or second band, which comprises exposing print material to light passing a first colour selective filter which filter is chosen to absorb light in the first spectral band but to pass freely light in the third spectral band and that part of the second spectral band excluding the said common band, further exposing said print material to light passing a second filter which second filter is chosen to absorb light in the second spectral band but to pass freely light in the third spectral band and that part of the first spectral band excluding the said common band, further exposing said print material to light passing a third filter in the path of the printing light for such time as it is necessary to reduce the exposure of print material to light in said third band below the total time for which the print material is exposed to light in said first and second bands, said third filter absorbing light in said third spectral band but passing light in at least one of the said first and second bands, the exposures through the aforesaid filters being effected in any predetermined sequence.

8. A method according to claim 7 wherein the first filter is a magenta filter and the second filter is a yellow filter, the said magenta and yellow filters each removing from the spectrum of printing light a common band lying between the blue and green bands of the spectrum.

9. A method according to claim 7 wherein the first filter is a magenta filter and the second filter is a cyan filter, the said magenta and cyan filters each removing from the spectrum of printing light a common band lying between the green and red bands of the spectrum.

References Cited

UNITED STATES PATENTS 3,229,569 1/1966 Frost et al. ........... 88—24

NORTON ANSHER, *Primary Examiner.*

R. A. WINTERCORN, *Assistant Examiner.*